(12) United States Patent
Snyder

(10) Patent No.: US 6,584,905 B1
(45) Date of Patent: Jul. 1, 2003

(54) PLATED THROUGH-HOLE IGNITOR FOR DETONATION CORD OR SHOCK TUBE

(76) Inventor: Richard N. Snyder, 8 Kristen Rd., Stafford, VA (US) 22554

( * ) Notice: Subject to any disclaimer, the term of this patent is extended or adjusted under 35 U.S.C. 154(b) by 3 days.

(21) Appl. No.: 09/866,808

(22) Filed: May 30, 2001

Related U.S. Application Data

(60) Provisional application No. 60/245,718, filed on Nov. 6, 2000.

(51) Int. Cl.[7] ............................. F42B 3/10; C06C 5/04
(52) U.S. Cl. ............................. 102/202.7; 102/202.12; 102/275.12; 102/275.6
(58) Field of Search .................... 102/202.7, 202.12, 102/275.12, 275.6

(56) References Cited

U.S. PATENT DOCUMENTS

| | | | |
|---|---|---|---|
| 3,797,393 A | * | 3/1974 | Marchandise et al. ... 102/202.7 |
| 5,144,893 A | | 9/1992 | Zeman et al. ............... 102/202 |
| 5,425,570 A | | 6/1995 | Wilkinson .................... 299/14 |
| 5,431,104 A | * | 7/1995 | Barker ................. 102/202.7 X |
| 6,129,976 A | * | 10/2000 | Mizushima et al. . 102/202.7 X |
| 6,199,484 B1 | * | 3/2001 | Martinez-Tovar et al. ................. 102/202.7 X |
| 6,408,758 B1 | * | 6/2002 | Duguet ................. 102/202.7 X |

* cited by examiner

Primary Examiner—Peter A. Nelson
(74) Attorney, Agent, or Firm—Venable LLP; Richard L. Aitken

(57) ABSTRACT

In a system for igniting detonation cord or shock tube, a plated through-hole in printed circuit board is coupled to a circuit to have high voltage and high current applied to the plated through-hole. The end of the detonation cord or shock tube is passed through the plated through-hole and formed into a knot to secure the detonation cord or shock tube in the plated through-hole. The voltage and current applied to the plated through-hole are of sufficient magnitude to explode the plated through-hole and ignite the detonation cord or shock tube.

17 Claims, 1 Drawing Sheet

PLATED THROUGH-HOLE IGNITOR FOR DETONATION CORD OR SHOCK TUBE

CROSS REFERENCE TO RELATED APPLICATIONS

This application claims the benefit of provisional application, Ser. No. 60/245,718 filed Nov. 6, 2000, invented by Richard N. Snyder entitled Printed Circuit Board Igniter.

This invention relates to an improved system for igniting shock tube or detonation cord to achieve safe ignition of explosive material.

BACKGROUND OF THE INVENTION

The safe ignition of explosives continues to be a problem. In a typical system detonation cord or shock tube is used to ignite the explosive materials. Both detonation cord and shock tube contain explosive materials and when the proximal end detonation cord or shock tube is ignited an explosion will travel along the length of the detonation cord or shock tube to the remote end of the shock tube to ignite explosive material at the remote end of the detonation cord or shock tube, usually by means of a blasting cap. Hereinafter detonation cord and shock tube are generically referred to as explosion transmitting line, which is defined to mean a line which will transmit a traveling explosion when ignited. A typical way of igniting the proximal end of explosion transmitting line is by means of a blasting cap. Since blasting caps are themselves dangerous and frequently cause injuries to the personnel using them, there is a need to improve the safety of the system used to ignite explosion transmitting line. In application Ser. No. 09/296287, filed Apr. 22, 1999 by Richard Snyder, the inventor of this application, there is disclosed a system in which the proximal end of shock tube is ignited by means of a hot high voltage spark which showers the proximal end of the shock tube with molten copper particles to provide reliable ignition of the shock tube. To further improve the safety of the system, the ignition spark is triggered by radio transmission. While the above described system is effective in providing safe reliable ignition of shock tube, it is not very effective in providing reliable ignition of detonation cord, which is harder to ignite. The system of the prior application is relatively expensive to use because the probe which defines the spark gap is relatively expensive and the probes are destroyed when they are used. Accordingly there is a need for a less expensive highly reliable and safe explosion transmitting line ignition system.

SUMMARY OF THE INVENTION

In accordance with the present invention the proximal end of the explosion transmitting line is ignited by means of a plated through-hole of a printed circuit board. The end of the explosion transmitting line is threaded through the plated. through-hole and is knotted to secure the explosion transmitting line in position in the through-hole. To ignite the explosion transmitting line, a high voltage from a high current source is applied across the through-hole. This high voltage and high current will cause the plated through-hole to explode and ignite the explosion transmitting line. In this manner safe and reliable ignition is achieved at very little cost because the plated through-hole is the same as those found in conventional printed circuit boards and is very inexpensive to manufacture.

DESCRIPTION OF THE PREFERRED EMBODIMENTS

Figure 1:
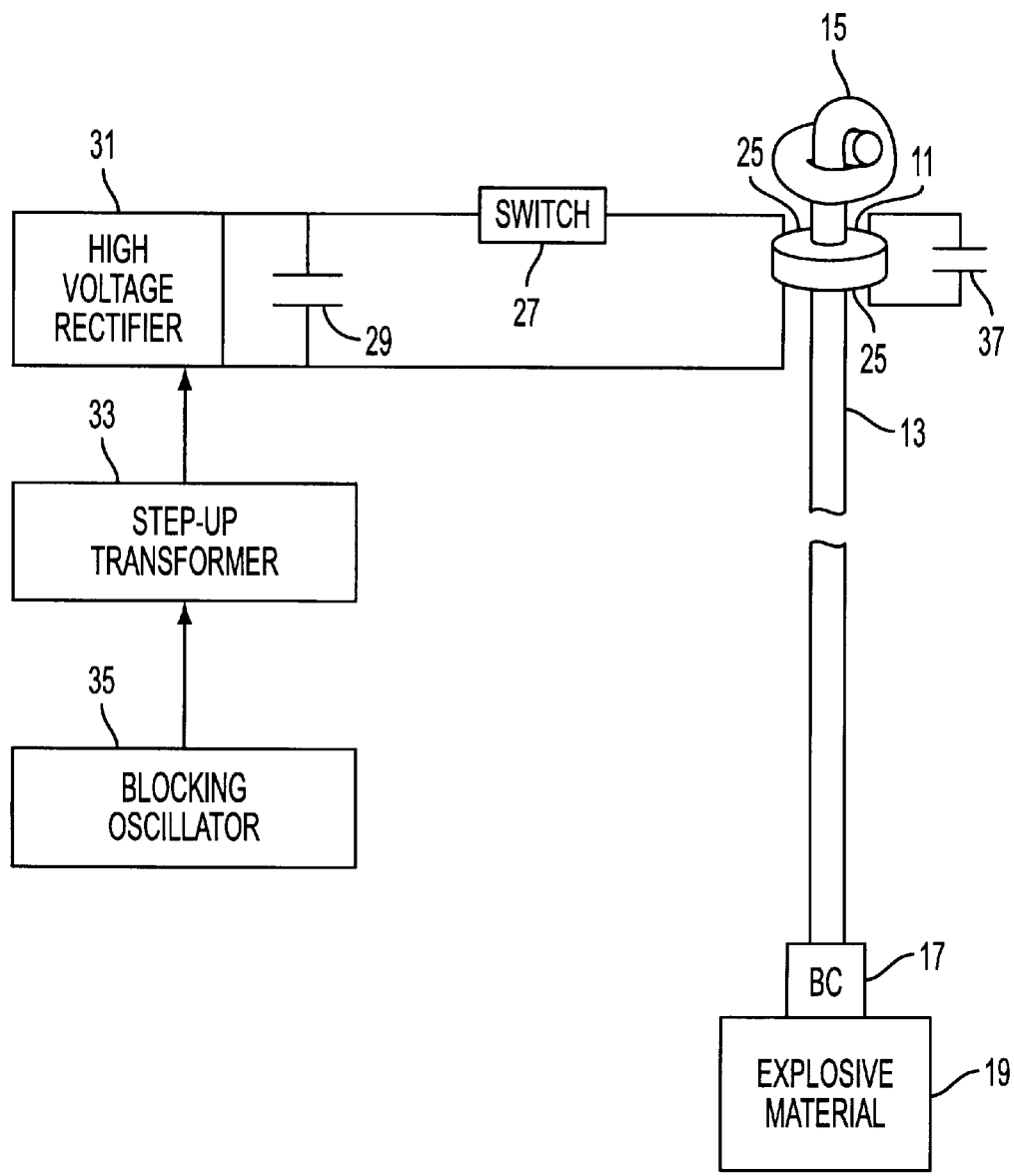
FIG. 1 is a diagram schematically illustrating the system of the invention in semi-block form.

As shown in FIG. 1 the system of the present invention comprises a printed circuit board plated through-hole 11 which is coupled to an explosion transmitting line 13, which may be detonation cord or which may be shock tube. The end of the explosion transmitting line is passed through the plated through-hole and is tied into a knot 15 to prevent the explosion transmission line from being pulled out of the plated through-hole. The distal end of the explosion transmitting line terminates in a blasting cap 17 which is coupled to explosive material 19 and thus is arranged to ignite the explosive material and cause it to explode when the blasting cap 17 is ignited.

Figure 2:
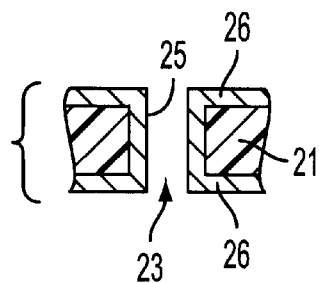
FIG. 2 is an axial sectional view of the plated through-hole employed in the system of the present invention.

As shown in FIG. 2, the plated through-hole comprises a piece of printed circuit board 21 defining a plated through-hole 23 which has cylindrical side walls. The piece of printed circuit board is made of insulation board and any insulating material may be substituted for the printed circuit board material. The cylindrical side walls of the hole 23 are plated with a layer 25 of electrically conducting material, which may for example be copper. The copper plating also overlaps each end of the plated through-hole to define flanges 26 around each end of the plated through-hole 23.

As shown in FIG. 1 the flanges 26 are connected through a switch 27 to the opposite sides of a capacitor 29 which is designed to receive and store a high voltage such as 400 volts with substantial electric charge so as to be capable of discharging a high current through the cylindrical layer 25 of the plated through-hole when the switch 27 is closed. The flanges 26 facilitate making connection to the capacitor, but they could be omitted and electrical connection made to opposite ends of the conducting cylindrical layer 25 formed on the wall of the hole 23. In the preferred embodiment the capacitor 29 is a 1000 uf capacitor. The capacitor is constructed so that when it is charged with 400 volts and then the switch 27 is closed, it will discharge a current with a sufficient magnitude to ignite an explosion in the explosive material in the explosion transmitting,line. It is believed that the high voltage and current explodes the plated through-hole and partially vaporize the copper of the plated through-hole and that this action ignites an explosion in the explosive material in the explosion transmitting line.

The capacitor 29 is charged through a high voltage rectifier 31 which receives a high voltage from a step-up. transformer 33. The step-up transformer 33 is energized by a blocking oscillator 35.

A small capacitor 37 is connected across the plated through-hole to bypass radio frequency energy to minimize radio interference.

In operation, the blocking oscillator energizes the step-up transformer 33 to supply a high voltage to the high voltage rectifier 31, which rectifies the voltage and charges the capacitor 29 to 400 volts, while the switch 27 remains open. After the capacitor 29 is charged, the switch 27 is closed to apply a high voltage and current to the cylindrical electrically conducting layer 25 of the plated through-hole causing the plated through-hole to explode and ignite the explosion transmitting line. Thereupon an explosion travels along the explosion transmitting line at a rate of 6,000 feet per second. The traveling explosion on reaching the blasting cap 17 will ignite the blasting cap and cause it to explode. This action in turn ignites and causes the explosive material 19 to explode.

To further improve the safety of the described system the switch 27 may be activated to a closed position by a radio signal.

The present invention, by using a printed circuit plated through-hole as a device which ignites the explosion transmitting line by being exploded by an applied high voltage and current, achieves a reliable and safe ignition of the explosive material 19 and this reliable and safe ignition is achieved at a very low cost.

The above description is of preferred embodiments of the invention and modifications may be made thereto without departing from the spirit and scope of the invention, which is defined in the appended claims.

What is claimed is:

1. An explosive material ignition system comprising an explosion transmitting line of the type containing explosive material whereby an explosion will travel along the length of said line when the explosive material in said line is ignited, a piece of an insulation board, a plated through-hole defined in said insulation board coupled to said explosion transmitting line, said plated through-hole comprising a layer of electrically conducting material formed on the wall of a hole extending through said piece insulation board, a circuit operable when triggered to apply a high voltage between the opposite ends of said plated through-hole on opposite sides of said insulation board to cause a high current to flow through said plated through-hole, the magnitude of said voltage and said current being sufficient to ignite the explosive material in said explosion transmitting line.

2. A system as recited in claim 1 wherein said explosion transmitting line is coupled to said plated through-hole by having an end of said explosion transmitting line extending through said plated through-hole.

3. A system as recited in claim 2 wherein said end of said explosion transmitting line is formed into a knot to prevent said explosion transmitting line from being pulled out of said plated through-hole.

4. A system as recited in claim 1 wherein said explosion transmitting line is detonation cord.

5. A system is recited in claim 1 wherein said explosion transmitting line is shock tube.

6. A system is recited in claim 1 wherein said a piece of insulation board is a piece of printed circuit board and said plated through-hole is a plated through-hole formed in said piece of printed circuit board.

7. A system for igniting explosion transmitting line comprising a piece of insulation board, a plated through-hole defined through said insulation board, said plated through-hole comprising a layer of electrically conducting material formed on the wall of a hole extending through said insulation board, a circuit for applying a high current and voltage to the ends of said layer on opposite sides of said insulation board, said current and said voltage being of sufficient magnitude to ignite explosive material in an explosion transmitting line coupled to said plated through-hole.

8. A system as recited in claim 7 wherein said plated through-hole is of sufficient diameter to permit an explosion transmitting line to pass through said plated through-hole.

9. A system as recited in claim 8 wherein said explosion transmitting line is detonation cord.

10. A system as recited in claim 8 wherein said explosion transmitting line is shock tube.

11. A system as recited in claim 7 wherein said piece of insulation board is a piece of printed circuit board and said plated through-hole is a plated through-hole defined in said piece of printed circuit board.

12. A method of igniting explosion transmitting line comprising coupling a plated through-hole formed in insulation board to the explosion transmitting line, said plated through-hole comprising electrically conducting material, and applying a voltage and current to the electrically conducting material of said plated through-hole with sufficient magnitude to ignite the explosive material in said explosion transmitting line.

13. A method as recited in claim 12 wherein said piece of insulation board comprises a piece of printed circuit board and said plated through-hole is a plated through-hole defined in said piece of printed circuit board.

14. A method as recited in claim 12 wherein said plated through-hole is coupled to said explosion transmitting line by positioning said explosion transmitting line in said plated through-hole.

15. A method as recited in claim 14 wherein the end of said explosion transmitting line is passed through said plated through-hole and is tied in a knot to prevent the end of said explosive transmitting line from being pulled from said plated through-hole.

16. A method as recited in claim 12 wherein said explosion transmitting line is detonation cord.

17. A method is recited in claim 12 wherein said explosion transmitting line is shock tube.

* * * * *